(12) United States Patent
Lin et al.

(10) Patent No.: US 7,829,996 B2
(45) Date of Patent: Nov. 9, 2010

(54) FILM STRUCTURE AND ELECTRONIC DEVICE HOUSING UTILIZING THE SAME

(75) Inventors: Juin-Hong Lin, Taipei Hsien (TW); Po-Wen Chan, Taipei Hsien (TW); Yu-Lun Ho, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/421,656

(22) Filed: Apr. 10, 2009

(65) Prior Publication Data

US 2010/0089637 A1   Apr. 15, 2010

(30) Foreign Application Priority Data

Oct. 9, 2008   (CN) .................... 2008 1 0304792

(51) Int. Cl.
*H01L 23/22* (2006.01)
*B32B 3/00* (2006.01)

(52) U.S. Cl. ............... 257/687; 257/702; 428/201; 428/206; 428/208; 428/322.2

(58) Field of Classification Search ............ 428/210, 428/195.1, 320.2, 201, 206, 208, 322.2; 257/687, 257/702
See application file for complete search history.

(56) References Cited

U.S. PATENT DOCUMENTS

| | | | | |
|---|---|---|---|---|
| 4,888,247 A * | 12/1989 | Zweben et al. | ............... | 428/105 |
| 5,989,484 A * | 11/1999 | Ikuina et al. | ............... | 264/618 |
| 6,326,427 B1* | 12/2001 | Birnbrich et al. | ............ | 524/398 |
| 6,413,618 B1* | 7/2002 | Parker et al. | ............. | 428/195.1 |
| 6,528,160 B1* | 3/2003 | Takushima | ............. | 428/355 R |
| 6,565,770 B1* | 5/2003 | Mayer et al. | ............ | 252/301.36 |
| 6,572,956 B1* | 6/2003 | Pickett et al. | ............... | 428/212 |
| 6,818,299 B2* | 11/2004 | Phillips et al. | ............... | 428/403 |
| 7,135,217 B2* | 11/2006 | Lansberry | ................ | 428/195.1 |
| 7,563,990 B2* | 7/2009 | Leurs et al. | ................. | 174/521 |

* cited by examiner

*Primary Examiner*—Cathy Lam
(74) *Attorney, Agent, or Firm*—Zhigang Ma

(57) ABSTRACT

An electronic device housing includes a substrate, a film structure, and a protective film. The film structure includes an adhesive film, a film stack, and a protective film. The adhesive film is deposited onto the substrate. The film stack is deposited onto the adhesive film alternating dielectric films and metal films. The metal films are non-continuous with a total thickness of the metal films at a predetermined value. The protective film is deposited onto an upper film of the film stack.

20 Claims, 4 Drawing Sheets

FILM STRUCTURE AND ELECTRONIC DEVICE HOUSING UTILIZING THE SAME

BACKGROUND

1. Technical Field

The disclosure relates to a film structure and an electronic device housing utilizing the same.

2. Description of the Related Art

Many electronic devices such as mobile phones employ a housing coated with a metal film to enhance appearance. The metal film typically exhibits high radio wave absorptivity. This feature decreases communication quality of the electronic devices, which largely depends on reliable throughput of radio wave transmission.

Therefore, it is desirable to provide a film structure and an electronic device housing utilizing the same which can overcome the described limitations.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the film structure and the electronic device housing. Moreover, in the drawings, like reference numerals designate corresponding parts throughout the several views.

DETAILED DESCRIPTION OF THE EMBODIMENTS

Embodiments of the film structure and the electronic device housing are described in detail here with reference to the drawings.

Figure 1:
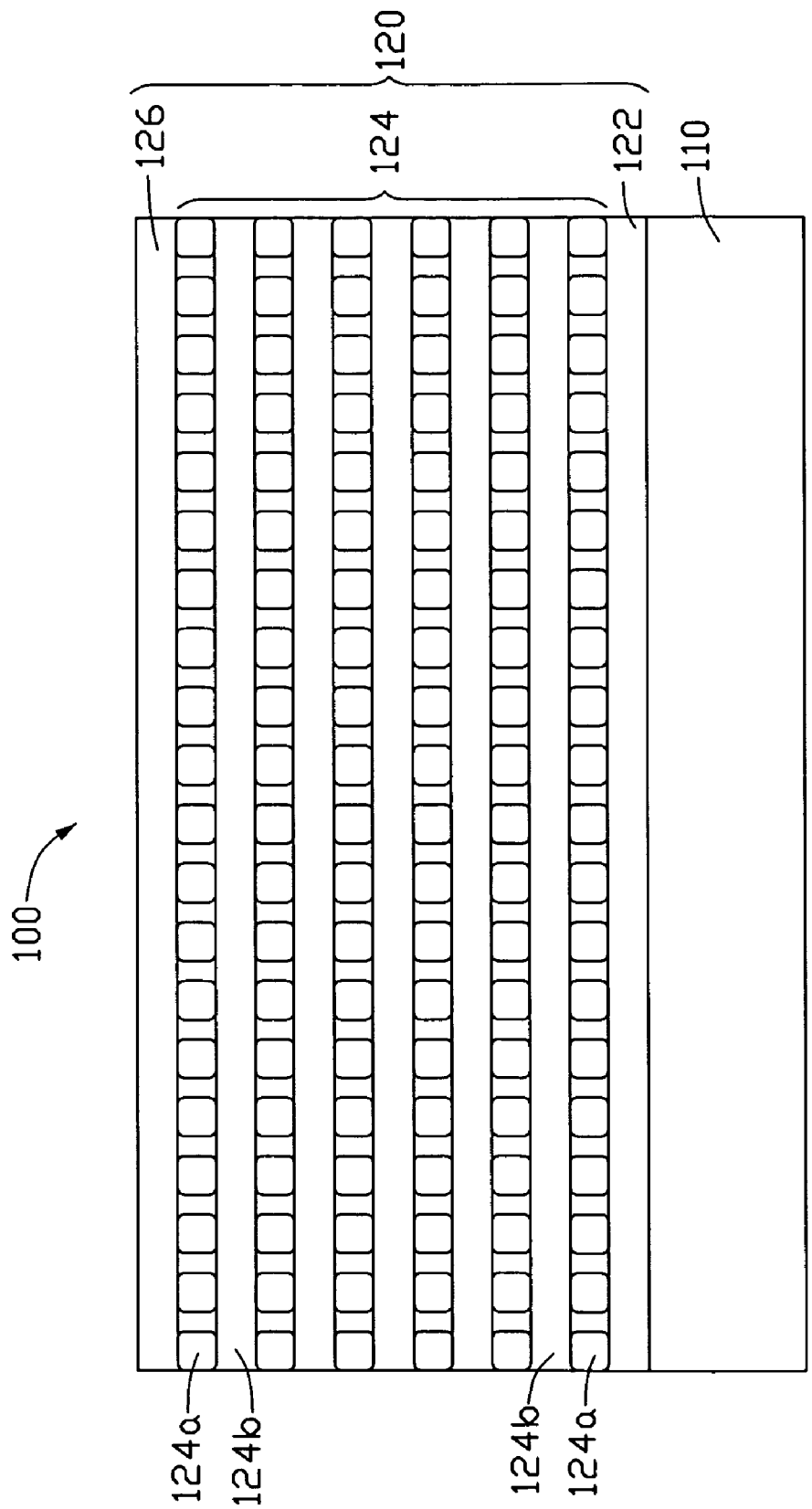
FIG. 1 is a schematic cross-section view of a sheet of an electronic device housing, according to the disclosure.

FIG. 1 is a schematic cross-section view of a sheet of an electronic device housing 100, according to the disclosure. The electronic device housing 100, such as a mobile phone housing, the sheet includes a substrate 110, and a film structure 120 disposed thereon. Here as an example, the substrate 110 is transparent material such as glass or plastic.

The film structure 120 includes an adhesive film 122, a film stack 124, and a protective film 126.

The adhesive film 122 is disposed on the substrate 110. The adhesive film 122 is a non-conductive material and provides high adhesion. For example, the adhesive film 122 can be silicon dioxide film formed by physical vapor deposition (PVD).

The film stack 124 is disposed on the adhesive film 122 and adhered to the substrate 110 thereby. The film stack 124 alternates at least one metal film 124a and at least one dielectric film 124b. The metal film 124a is a non-continuous film and may be Chromium (Cr), Aluminum (Al), or Silver (Ag). The dielectric film 124b is non-conductive silicon dioxide film. Here, the metal film 124a and the dielectric film 124b are formed by PVD.

A metal film 124a exhibits a maximum reflectivity at a requisite thickness. Disposition of metal film 124a is non-continuously conducted prior to achieving the requisite thickness. As the thickness of the metal film 124a increases, the structure approaches continuity. Thus, to obtain maximum reflectivity and communication quality of the electronic device, the metal film is less than the requisite thickness. For example, an Al film stack achieves maximum light reflectivity, about 60%, at thickness of 30 nm (not including the alternative dielectric film 124b). However, such a 30 nm Al film stack solely disposed on the substrate 110 is continuous. As a result, the electronic device will be shielded by the Al film, with communication quality thereof suffering. To solve the problem, as mentioned, the 30 nm Al film is separated into 6 layers and alternated with the dielectric layers. The layers of the Al film can have a similar or different thickness. However, the total thickness of the metal film 124a is formed from 20 to 40 nm.

The protective film 126 is configured to protect the film stack 124 from oxidization, and can be non-conductive material such as silicon dioxide. However, if the top layer of the film stack is a dielectric film 124b, the protective film 126 can be omitted and the dielectric film 124b can function as the protective film.

Figure 2:
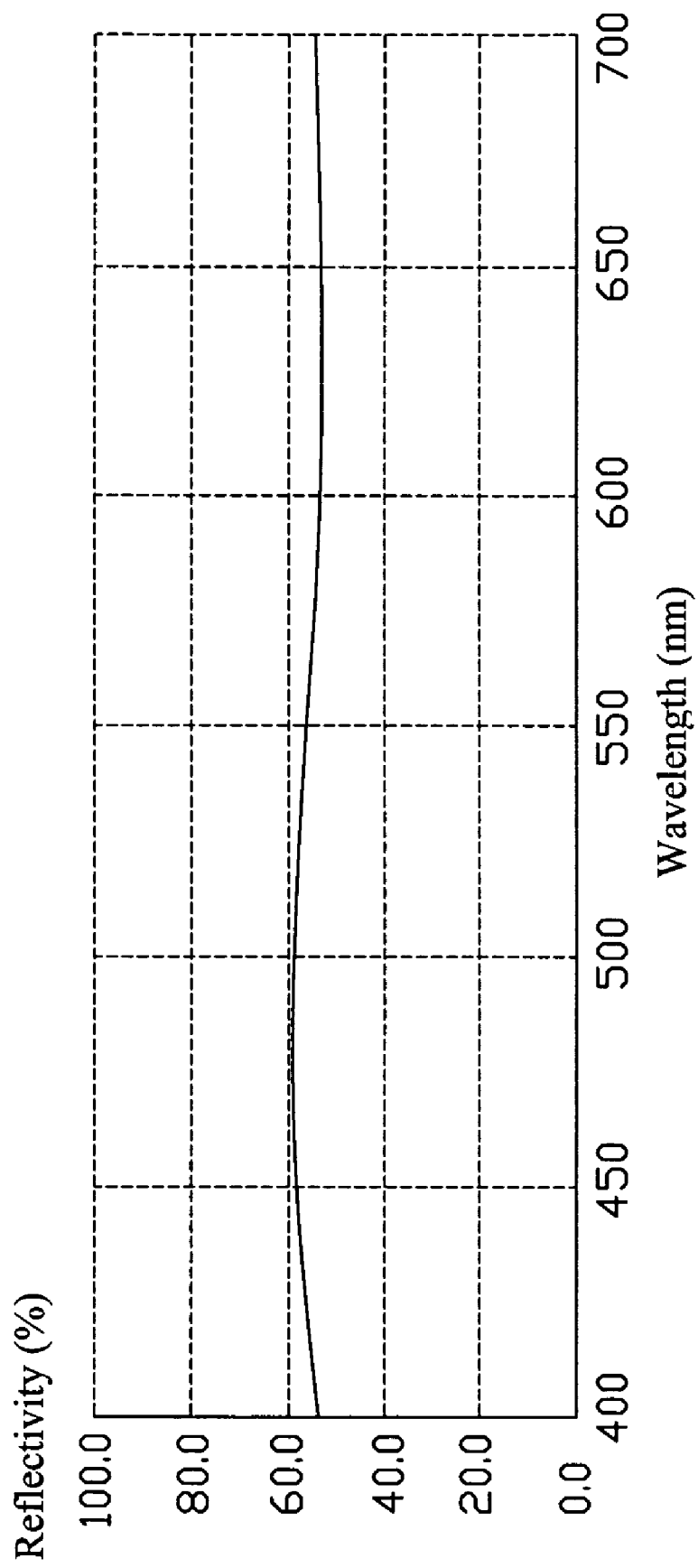
FIG. 2 is a graph showing spectral characteristics of a first embodiment of a film structure applied in the electronic device housing of FIG. 1, according to the disclosure.

FIG. 2 is a graph showing spectral characteristics of a first embodiment of an electronic device housing 100. In this embodiment, the film stack 124 includes six metal films 124a and five dielectric films 124b. Here, each metal film 124a is Cr film, and has a thickness of 5 nm.

Table 1 presents a relationship of refractive index (n) and extinction coefficient (k) of the Cr film from different wavelengths of visible light.

TABLE 1

| Wavelength (nm) | Refractive index (n) | Extinction coefficient (k) |
| --- | --- | --- |
| 400 | 1.48 | 3.54 |
| 450 | 1.99 | 4.22 |
| 500 | 2.75 | 4.46 |
| 550 | 3.18 | 4.41 |
| 600 | 3.48 | 4.36 |
| 650 | 3.65 | 4.36 |
| 700 | 3.84 | 4.37 |

If the metal film 124a is Cr, the n of the electronic device housing 100 is approximately 60%. Consequently, the mirror effect increases with n.

Figure 3:
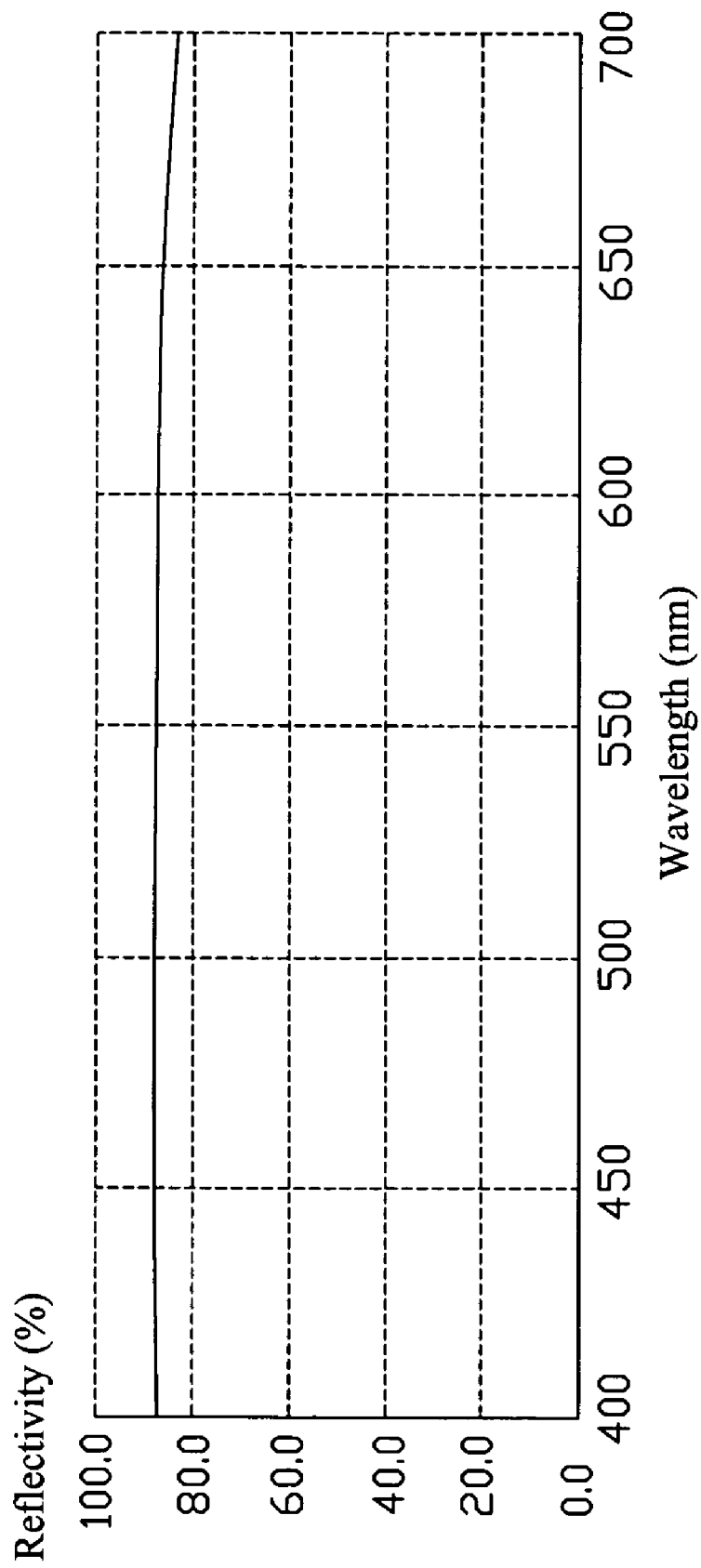
FIG. 3 is a graph showing spectral characteristics of a second embodiment of a film structure applied in the electronic device housing of FIG. 1, according to the disclosure.

In FIG. 3, spectral characteristics of a second embodiment of the electronic device housing 100 are shown, differing from the first embodiment in that metal film 124a is Al.

Table 2 presents a relationship of the n and the k of the Al film from different wavelengths of visible light.

TABLE 2

| Wavelength (nm) | Refractive index (n) | Extinction coefficient (k) |
| --- | --- | --- |
| 400 | 0.37 | 4.25 |
| 450 | 0.47 | 4.84 |
| 500 | 0.64 | 5.50 |
| 550 | 0.82 | 5.99 |
| 600 | 1.05 | 6.50 |
| 650 | 1.30 | 7.11 |
| 700 | 1.55 | 7.21 |

With metal film 124a of Al, the n of the electronic device housing 100 exceeds 80%. As before, the mirror effect increases with n.

Figure 4:
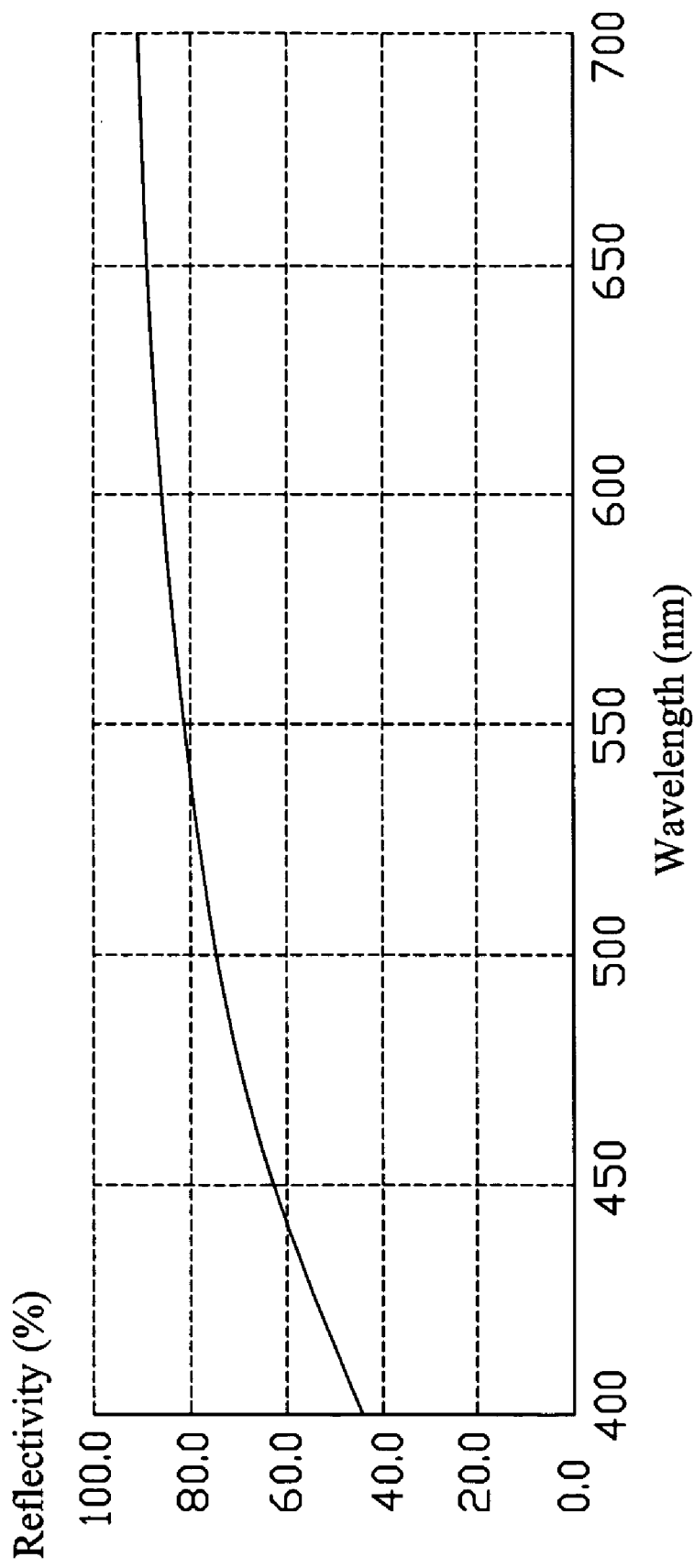
FIG. 4 is a graph showing spectral characteristics of a third embodiment of a film structure applied in the electronic device housing of FIG. 1, according to the disclosure.

In FIG. 4, spectral characteristics of a third embodiment of the electronic device housing 100 are shown, differing from the first embodiment in that metal film 124a is Ag.

Table 3 presents a relationship of the n and the k of the Ag film from different wavelengths of visible light.

TABLE 3

| Wavelength (nm) | Refractive index (n) | Extinction coefficient (k) |
| --- | --- | --- |
| 400 | 0.075 | 1.93 |
| 450 | 0.055 | 2.42 |
| 500 | 0.050 | 2.87 |
| 550 | 0.055 | 3.32 |
| 600 | 0.060 | 3.75 |
| 650 | 0.070 | 4.20 |
| 700 | 0.080 | 5.05 |

If the metal film 124a is Ag film, the n of the electronic device housing 100 is from 50% to 90%. As before, the mirror effect increases with n.

It is noted that in the film stack 124, metal film and alternating dielectric film, each forms an island structure (rough and uneven in surface) so that signals from the electronic device housing 100 pass therethrough, providing optimum communication without shielding.

While the disclosure has been described by way of example and in terms of preferred embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A film stack comprising:
    a metal film comprising a plurality of non-continuous layers; and
    a plurality of dielectric layers alternated with the non-continuous layers;
    wherein a sum of thicknesses of the non-continuous layers is at a predetermined value.

2. The film stack of claim 1, wherein the predetermined value is in a range from about 20 nm to about 40 nm.

3. The film stack of claim 1, wherein the thicknesses of the non-continuous layers are different.

4. The film stack of claim 1, wherein the thicknesses of the non-continuous layers are the same.

5. The film stack of claim 1, wherein the metal film is selected form the group consisting of chromium, aluminum, and silver.

6. The film stack of claim 1, wherein the dielectric layers are made of silicon dioxide.

7. The film stack of claim 1, wherein a top layer of the film stack is one of the dielectric layers and is configured for protecting the film stack from oxidization.

8. A film structure comprising:
    an adhesive film configured for adhering a film fixture to a substrate;
    a film stack deposited on the adhesive film and comprising:
        a metal film of a predetermined thickness divided into a plurality of non-continuous layers; and
        a plurality of dielectric layers alternated with the non-continuous layers; and
    a protective layer deposited on the film stack.

9. The film structure of claim 8, wherein the predetermined thickness is in a range form about 20 nm to about 40 nm.

10. The film structure of claim 8, wherein the thicknesses of the non-continuous layers are different.

11. The film structure of claim 8, wherein the thicknesses of the non-continuous layers are the same.

12. The film structure of claim 8, wherein the metal film is selected form the group consisting of chromium, aluminum, and silver.

13. The film structure of claim 8, wherein the dielectric layers are made of silicon dioxide.

14. The film structure of claim 8, wherein the adhesive film is made of silicon dioxide.

15. The film structure of claim 8, wherein the protective film is made of silicon dioxide.

16. An electronic device housing, comprising:
    a substrate;
    an adhesive film deposited on the substrate;
    a film stack adhered to the substrate via the adhesive film, the film stack comprising:
    a plurality of non-continuous metal films and a plurality of dielectric films alternately formed, a sum of thicknesses of the non-continuous layers films is at a predetermined value; and
    a protective film deposited on the film stack.

17. The electronic device housing of claim 16, wherein the predetermined value is in a range from about 20 nm to about 40 nm.

18. The electronic device housing of claim 16, wherein thicknesses of the non-continuous metal films are different.

19. The electronic device housing of claim 16, wherein thicknesses of the non-continuous metal films are the same.

20. The electronic device housing of claim 16, wherein the dielectric layers are made of silicon dioxide.

* * * * *